(12) United States Patent
Hassanzadeh et al.

(10) Patent No.: US 6,428,360 B2
(45) Date of Patent: Aug. 6, 2002

(54) MEMORY MODULE WITH OFFSET NOTCHES FOR IMPROVED INSERTION AND STABILITY AND MEMORY MODULE CONNECTOR

(75) Inventors: Ali Hassanzadeh, Fremont; Victor Odisho, San Jose, both of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/756,035

(22) Filed: Jan. 4, 2001

Related U.S. Application Data

(63) Continuation of application No. 09/293,120, filed on Apr. 16, 1999, now Pat. No. 6,315,614.

(51) Int. Cl.$^7$ .............................................. H01R 24/00
(52) U.S. Cl. .................................. 439/633; 439/159
(58) Field of Search ........................ 439/153, 157, 439/159, 160, 326, 633, 680, 681; 365/52

(56) References Cited

U.S. PATENT DOCUMENTS

| | | | | |
|---|---|---|---|---|
| 3,364,458 A | * | 1/1968 | Black et al. | 439/680 |
| 4,307,927 A | | 12/1981 | Mollman | 439/681 |
| 5,041,023 A | | 8/1991 | Lytle | 439/637 |
| 5,162,979 A | * | 11/1992 | Anzelone et al. | 361/686 |
| 5,277,591 A | | 1/1994 | Felcman et al. | 439/60 |
| 5,383,148 A | | 1/1995 | Testa et al. | 365/52 |
| 5,470,240 A | | 11/1995 | Suzuki | 439/157 |
| 5,688,147 A | * | 11/1997 | Coteus et al. | 439/681 |
| 5,775,925 A | | 7/1998 | Tondreault | 439/157 |
| 5,803,761 A | | 9/1998 | Mochizuki | 439/326 |

* cited by examiner

*Primary Examiner*—Khiem Nguyen
*Assistant Examiner*—Michael C. Zarroli
(74) *Attorney, Agent, or Firm*—Conley, Rose & Tayon, PC; B. Noël Kivlin

(57) ABSTRACT

A memory module with offset notches for improved insertion and a memory module connector for mating thereto. The connector housing includes an accommodating space for receiving a portion of the memory module printed circuit board (PCB). A first key is disposed within the accommodating space of the housing and is positioned between the first end and the center of the housing. A second key is further disposed within the accommodating space and is positioned between the second end of the housing and the center. A distance between the first key and the second key is greater than 40% of the length of the housing. Either the first, second, or both keys may extend from the accommodating space beyond a top plane defined by a top side of the accommodating space of the housing. The memory module comprises the PCB with a first notch positioned between the first end of the PCB and the center of the PCB. A second notch is positioned between the second end of the PCB and the center of the PCB. A distance between the first notch and the second notch is greater than 40% of the length of the PCB. The first notch may be farther from the first end of the PCB than from the center, and the second notch may be closer to the second end of the PCB than to the center.

45 Claims, 5 Drawing Sheets

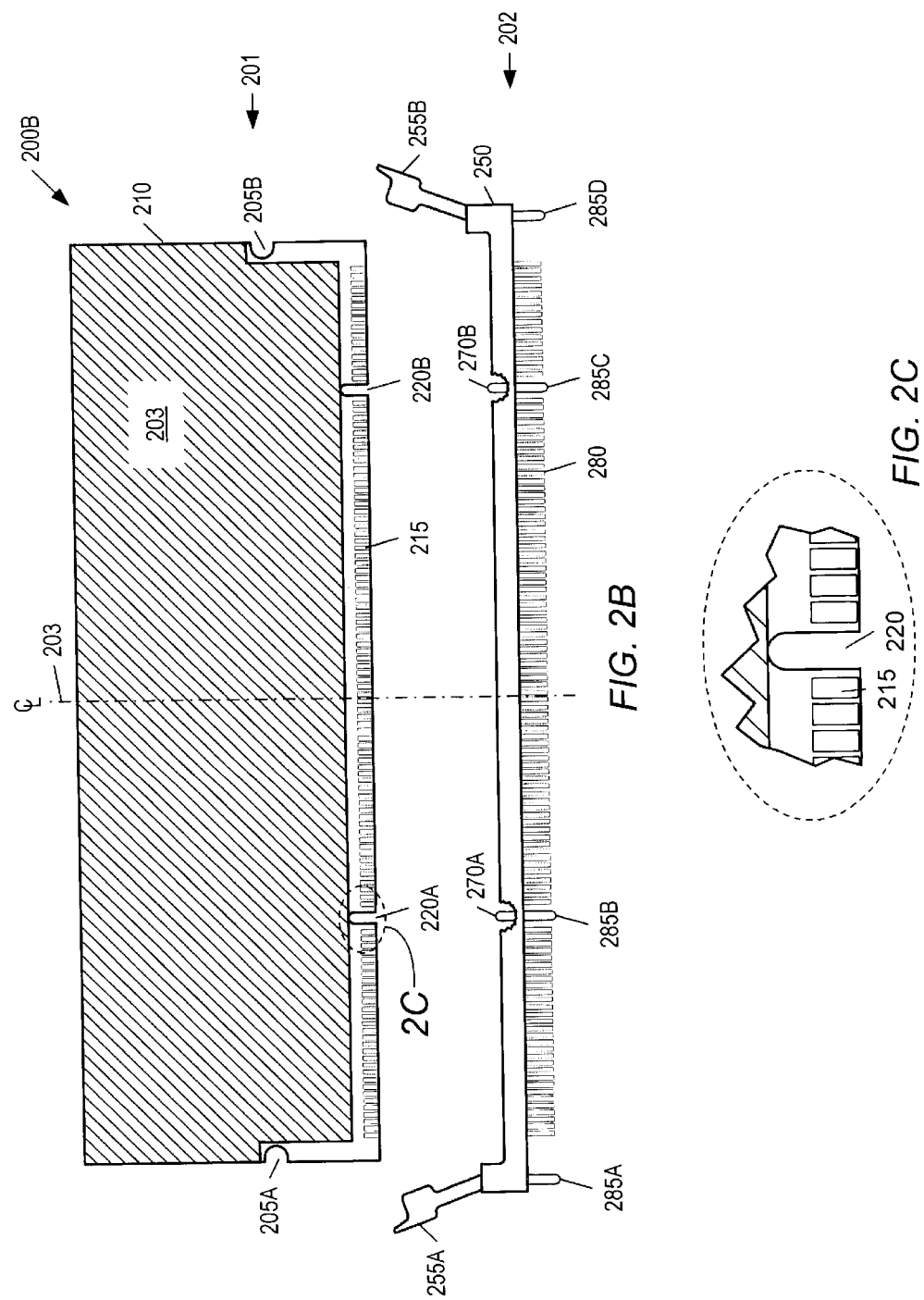

MEMORY MODULE WITH OFFSET NOTCHES FOR IMPROVED INSERTION AND STABILITY AND MEMORY MODULE CONNECTOR

This application is a continuation of U.S. patent application Ser. No. 09/293,120, filed Apr. 16, 1999, now U.S. Pat. No. 6,315,614.

BACKGROUND OF THE INVENTION

1. Field of the Invention

This invention relates to memory modules for expanding memory capacity in computer systems and to memory module connectors.

2. Description of the Related Art

Both single in-line memory modules (SIMMs) and dual in-line memory modules (DIMMs) and corresponding memory module connector sockets for expanding memory with computer systems are well known Generally speaking, in-line memory modules include a printed circuit board on which a plurality of memory chips such as DRAMs are surface mounted. A connective portion along one edge of the printed circuit board is adapted for insertion into a mating (i.e. accommodating) space of a connector. A plurality of contact pads (also called pins) on the connective portion mates with a plurality of corresponding contacts inside the accommodating space of the connector to provide for the transfer of electrical signals between the memory module and the rest of the computer system.

On a SIMM, the connective portion usually includes a plurality of contact pads on either the front side of the edge of the printed circuit board or on both the front and back sides of the printed circuit board. In configurations that include contact pads on both the front and back sides of a SIMM, opposing contact pads on the two sides are typically shorted together and therefore carrying the same electrical signal. In a DIMM, the contacts are positioned in the connective portion on both the front and back sides of the printed circuit board. At least some of the opposing contact pads on the two sides of the printed circuit board of a DIMM are configured to carry differing electrical signals, thereby increasing the signal density without necessitating smaller contact pads or a larger printed circuit board.

FIGS. 1A and 1B illustrate two embodiments of prior art DIMM memory modules 100 and 150, respectively. Memory modules 100 and 150, as shown, include 84 contact pads, such as contact pads 115A and 165A, on the front side, for 168 total contact pads. It is noted that the number of contact pads may vary such that memory modules with up to 200 contact pads are available on the market.

Memory modules 100 and 150 are configured to couple to appropriate memory module connectors, which are specifically designed to mate and secure the memory module. In general, a connector comprises a housing including an accommodating space, which is adapted to receive a portion of the printed circuit board of the memory module.

Turning to FIG. 1A in detail, memory module 100 includes a printed circuit board 110. A region 103, shown with dashed lines, for the placement of semiconductor integrated circuits, such as DRAM memory chips or other appropriate memory, occupies the majority of the space on a face of the printed circuit board 110. The contact pads 115 are disposed along one edge (i.e. the connective portion) of the printed circuit board 110 from a short distance from the left end to approximately the same distance from the right end. The center of the length of the printed circuit board 110 is marked with a centerline 101. A single notch 120 is positioned along the one edge at substantially the center of the edge of the printed circuit board 110. In other known embodiments, notch 120 may alternatively be positioned approximately one-half of the width of the notch to either side of the center location, as noted with dashed lines. Additional details regarding the notches 120 may be found with respect to FIG. 1C below. The printed circuit board 110 also includes indentions 105A and 105B positioned on the left end and right end, respectively. The indentations 105A and 105B are shaped to receive module extractors, which may be included as a part of the connector, to hold the memory module 100 in place when the module extractors are in a closed position.

Turning to FIG. 1B in detail, memory module 150 includes a printed circuit board 160. The contact pads 115 are disposed along one edge of the printed circuit board 160. The center of the length of the printed circuit board 160 is marked with a centerline 151. A center notch 120A is positioned along the one edge at substantially the center of the edge of the printed circuit board 160. Memory module 150 also includes a left notch 120B positioned to the left of center. Similar to the center notch 120A, the location of the left notch 120B is also known in other embodiments to be repositioned approximately one-half of the width of the notch 120B to either side of the illustrated location. The printed circuit board 160 also includes indentions 105C and 105D positioned on the left end and right end, respectively.

FIG. 1C is a close-up view of a notch 120. As shown, notch 120 is located on the edge of the printed circuit board 110 or 160 in a space along the row of contact pads 115. The height of the notch 120 is just slightly higher than the corresponding size of the contact pads 115.

It is noted that the notches 120 are configured to mate with keys in the accommodating space in the housing of the corresponding connector. A center key, which is configured to mate with a center notch 120 or 120A, of the connector may be referred to as the "voltage key", while the left key, which is configured to mate with left notch 120B, may be referred to as the "functionality key". The names refer to the different voltages and/or functionalities that the three locations for each key (and therefore notch) correspond, depending on the manufacturer or standard.

One problem associated with the memory modules 100 and 150 is the difficulty in correctly installing the memory module 100 or 150 in the corresponding connector. Even with installation guides as a part of the connector, the memory module 100 or 150 may be installed backwards or unevenly. While the use of a polarized two-notch memory module, such as memory module 150, may decrease the likelihood of installing the memory module backwards, the notches 120A and 120B may not aid in installing the memory module evenly. It may be possible to install the memory module 150 with a slight tilt leading to one or more misconnections or even shorts. A related problem is the stability of the memory module 100 or 150 once inserted in the corresponding connector. Additional stabilizing features may inhibit simple and accurate insertion, which may further lead to uneven insertion and improper connections. Thus, it can be seen that an improved memory module, connector, and system thereof with improved ease of insertion and stability are desired.

SUMMARY OF THE INVENTION

The problems outlined above are in large part solved by an improved memory module with offset notches for improved insertion and stability and an improved memory module connector configured to receive the memory module. In one embodiment, the connector includes a first end, a second end, and a center midway between the first end and the second end. The connector housing further includes an accommodating space for receiving a connective portion of a printed circuit board of a memory module. A first key and a second key are disposed within the accommodating space of the housing. The first key is positioned between the first end of the housing and the center. The second key is positioned between the second end of the housing and the center. A distance between the first key and the second key is greater than 40% of the length of the connector housing. In one embodiment, one or more of the first key and the second key extend from the accommodating space beyond a top plane defined by a top side of accommodating space of the housing. The distance between the keys may advantageously allow for greater stability for a memory module coupled to the connector without compromising ease of insertion.

In another embodiment, a memory module is contemplated that includes a printed circuit board including a connective portion configured to be inserted into a memory module connector. The connective portion of the printed circuit board includes a first end, a second end, and a center midway between the first end and the second end. A first notch and a second notch are positioned in the connective portion of the printed circuit board. The first notch is positioned between the first end of the printed circuit board and the center. The second notch is positioned between the second end of the printed circuit board and the center. The distance between the first notch and the second notch is greater than 40% of the length of the printed circuit board. In one embodiment, the first notch is farther from the first end of the printed circuit board than from the center, and the second notch is closer to the second end of the printed circuit board than to the center. The distance between the notches may advantageously allow for greater stability of the memory module while coupled to a connector socket without compromising ease of insertion.

BRIEF DESCRIPTION OF THE DRAWINGS

Other objects and advantages of the invention will become apparent upon reading the following detailed description and upon reference to the accompanying drawings in which:

FIG. 2B is a side view of the embodiment the memory module and connector of FIG. 2A;

FIG. 2C is a close-up view of a notch shown in FIG. 2B;

Figure 1A:
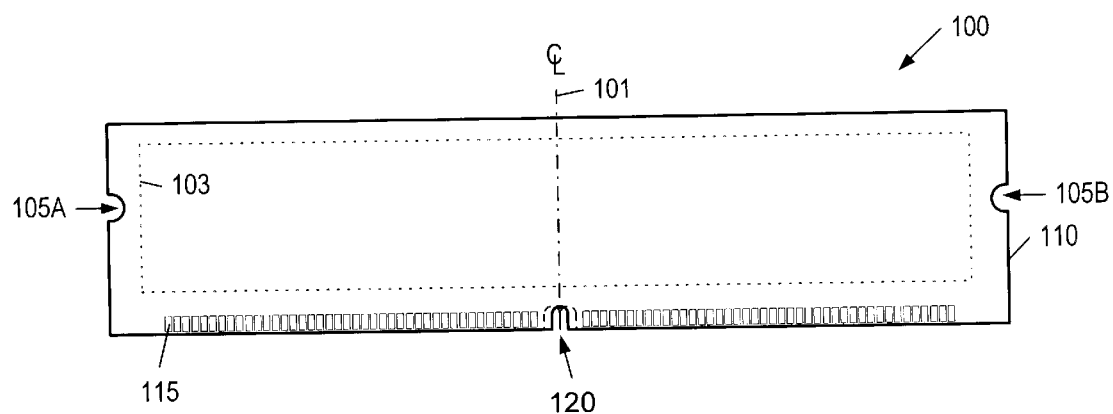
FIGS. 1A and 1B are side views of embodiments of memory modules in the prior art.
Figure 1B:
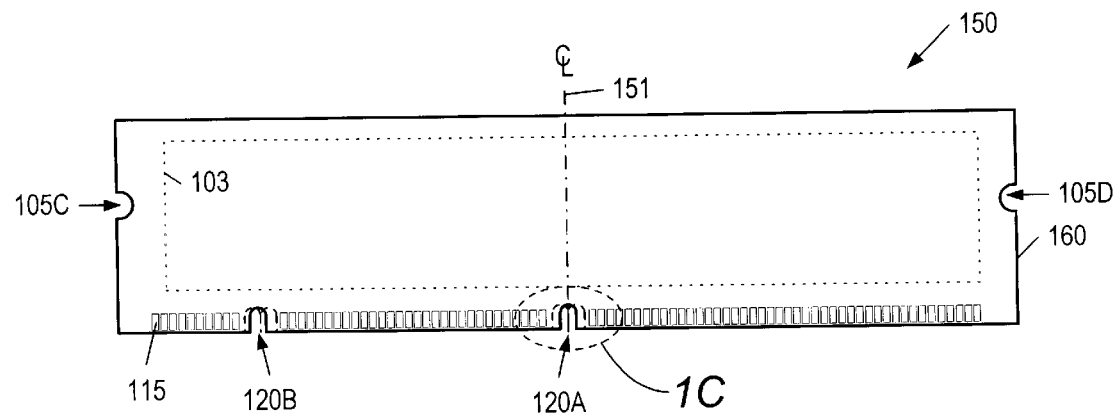
Figure 1C:
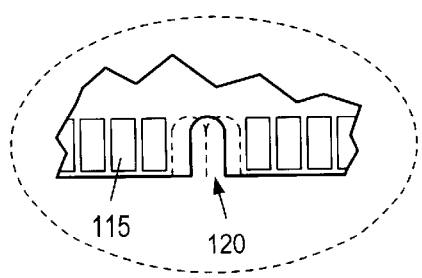
FIG. 1C is a close-up view of a prior art notch.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2A:
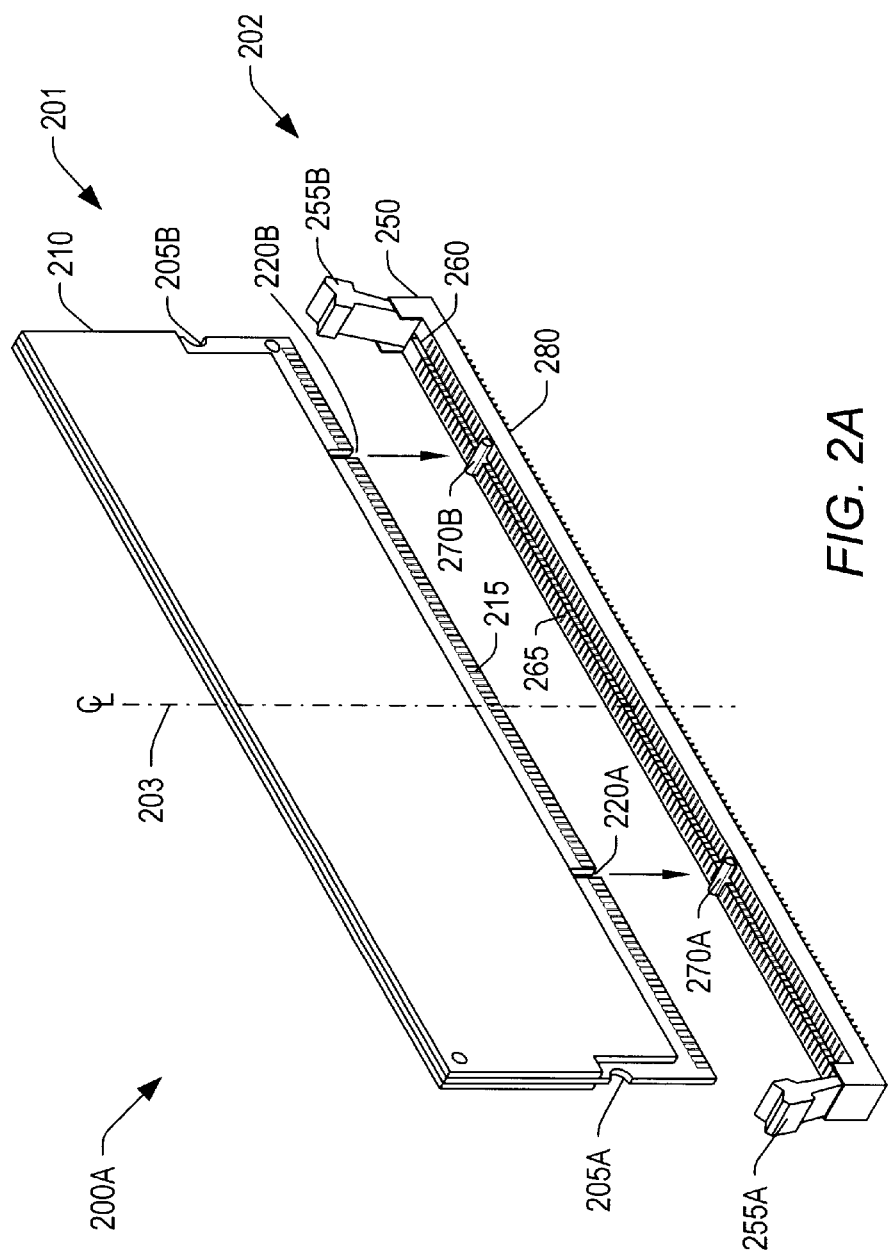
FIG. 2A is an embodiment of a memory module including off-set notches for improved insertion into a connector including off-set keys.

Turning to FIG. 2A, an embodiment of a memory module 201 including off-set notches 220 for improved insertion into a connector 202 including off-set keys 270 is shown in a three-dimensional view 200A. The memory module 201 includes a printed circuit board 210. The printed circuit board 210 is shown as a multiple layer composite printed circuit board including a region (refer to 202 in FIG. 2B) for one or more semiconductor memory chips, such as DRAM. The center of the length of the printed circuit board 210 is marked with a centerline 203. The memory module 201 includes a first notch 220A positioned along an edge of the printed circuit board 210 between the first end (left as shown) of the printed circuit board 210 and the center of the printed circuit board 210. A second notch 220B is positioned along the same edge of the printed circuit board 210 between a second end (right as shown) of the printed circuit board 210 and the center of the printed circuit board 210. The distance between the first notch and the second notch is greater than 40% of the length of the printed circuit board 210.

A plurality of contact pads 215 may also be included along the edge of the printed circuit board 210 of the memory module 201. As shown, the first and second notches 220A and 220B divide the contact pads 215 into three groups. The first group is between the first edge of the printed circuit board 210 and the first notch 220A. The second group is between the first notch 220A and the second notch 220B. The third group is between the second notch 220B and the second edge of the printed circuit board 210. Similar groupings of the contacts of the connector 202 are discussed in detail with respect to FIG. 2D.

The memory module 201 may also includes indentations 205A and 205B located on the ends of the printed circuit board 210 of the memory module 201. The indentations 205A and 205B are each configured to receive a corresponding portion of a module extractor of a connector, such as module extractors 255 of connector 202.

In one embodiment, the first notch 220A is farther from the first end of the printed circuit board 210 than from the center, while the second notch 220B is closer to the second end of said printed circuit board 210 than to the center. In another embodiment, the plurality of contact pads 215 are configured to abut a corresponding plurality of contacts 265 in an accommodating space 260 of a connector, such as connector 202, when the printed circuit board 210 is received within the accommodating space 260.

Also shown in FIG. 2A is a connector 202 configured to receive a memory module such as memory module 201. The connector 202 includes a housing 250 with a length. The center of the length is shown with the centerline 203. The housing 250 includes a first end and a second end in a fashion that parallels the printed circuit board 210 of the memory module 201. The housing 250 further includes an accommodating space 260, which is adapted to accommodate a portion of a printed circuit board, such as the printed circuit board 210 of the memory module 201. A first key 270A is disposed within the accommodating space of the housing 250, positioned between the first end of the housing 250 and the center. A second key 270B is also disposed within, the accommodating space of the housing 250 between the second end of the housing 250 and the center. The distance between the first key and the second key is greater than 40% of the length of the housing 250.

The housing 250 of the connector 202 preferably also includes a plurality of contacts 265 arranged within the accommodating space 260. The contacts 265 are configured to abut a corresponding plurality of contact pads 215 on the printed circuit board 210 when the printed circuit board 210 is partially received within the accommodating space 260. The connector 202 also preferably includes two module extractors 255A and 255 each coupled to an end of the housing 250. Each module extractor 255 is rotationally operable to move between a closed position (shown in FIG. 3) and an open position (shown in FIGS. 2A and 2B). In the closed position, each module extractor 255 is operable to "lock" in place at a corresponding indentation, such as indentations 205 of memory module 201. As shown, a plurality of solder connectors 280 may extend from the bottom side of the connector 202. The solder connectors 280 are operable to electrically couple the connector 202 through a mounting surface.

The memory module 201 is shown in FIG. 2A preparing to couple with connector 202, as shown by the arrows between the notches 220 and the keys 270. When the coupling is complete, the module extractors 255 will mate with the indentations 205 as the memory module 201 and the connector 202, mechanically and electrically, securely "lock" into place.

In one embodiment, the housing 250 of the connector 202 includes a top side, which defines a top plane of the accommodating space 260. In this embodiment, one or more of the keys 270A and 270B key extend from the accommodating space 260 beyond the top plane. One or more keys 270 may extend beyond the top plane of the accommodating space 260 by varying amounts. In a preferred embodiment, both keys 270A and 270B extend from the accommodating space 260 beyond the top plane by a distance of at least 0.050 inches. In another embodiment, the first key is farther from the first end of the housing 250 than from the center. In this embodiment, the second key is closer to the second end of the housing 250 than to the center.

In various embodiments, the number of contacts 265 within the accommodating space 260 may vary, above at least 200 contacts. In a preferred embodiment, the plurality of contacts 265 includes 232 contacts. In one embodiment, the plurality of contacts 265 is disposed within the accommodating space 260 so as to be vertically opposed to each other. When the portion of the printed circuit board 210 is inserted into the accommodating space 260, the printed circuit board 210 is weakly held between the contacts 265. As the printed circuit board 210 is pushed down to an implementation position, a tip of the printed circuit board 210 elastically deforms the contacts 265 so that the contact pads 215 of the printed circuit board 210 and the contacts 265 are brought into contact with each other as pressed by thus yielded elastic force.

A side view 200B of the memory module 201 and connector 202 is shown in FIG. 2B. The portion 203 of the memory module 201 operable to receive semiconductor chips is shaded. The notches 220A and 220B, as well as the contact pads 215, divided into three groups, are shown. The indentations 205A and 205B are also shown here. The center of the memory module 201 is again denoted by the centerline 203. The connector 202 is shown with the module extractors 255A and 255B on the ends and key 270A and 270B on the top side extending from the top plane (i.e. the upper edge in the side view) of the accommodating space (not shown) of the connector 202. The area around the keys 270A and 270B is cut-away to show the keys 270. The bottom side of the connector 202 shows additional detail in this side view 200B. Besides a plurality of solder connectors 280, a plurality of placement posts 285 is also disposed on the housing 250 opposite the accommodating space (i.e. the bottom side). Each placement post 285 is configured to mate with a corresponding hole in a mounting surface, such as a circuit board.

In various embodiments, the location of the first and second notches 220A and 220B and the first and second keys 270A and 270B may vary. It is contemplated that the first key 270A may be located along the length of the connector 202 between 15% and 35% of that length, as measured from the first end, while the second key 270B may be located along that length between 65% and 85% of the length of the connector 202, also measured from the first end. It is likewise contemplated that the first notch 220A may be located between 15% and 35% of the length of the memory module 201, as measured from the first end of the memory module, while the second notch 220B may be located between 65% and 85% of the length of the memory module 201, also measured from the first end. In one embodiment, the distance between the first notch and the second notch is greater than 50% of the length of the memory module. In another embodiment, the distance between the first key and the second key is greater than 50% of the length of the connector.

In one contemplated embodiment, the first key is at least 1.525 inches from the first end, and the second key is at least 0.825 inches from the second end. In a preferred embodiment, the first key is 0.061 inches in width and located 1.900 inches from the first end. In this embodiment, the second key is also 0.061 inches in width and located 5.50 inches from the first end.

In various embodiments, the number and location of the placement posts may vary. The illustrated embodiment includes four placement posts. The two outer placement posts 285A and 285D are each located 0.075 inches from the left and right ends, respectively. The two inner placement posts 285B and 285C are shown spaced 3.600 inches apart, corresponding to the locations of the first and second keys 270A and 270B. It is contemplated that the plurality of solder connectors 280 may be rearranged so that the placement posts 285 may be positioned as desired along the bottom side of the connector 202. In a preferred embodiment, two placement posts 285 are located at least 3.600 inches apart.

It is noted that in various embodiments, the dimensions of the memory module 201 may vary. The overall length of the memory module 201 is preferably 6.400±0.005 inches. The overall span of the plurality of contact pads 215 is preferably 5.950 inches, with a space of 0.150 inches allowed for each notch 220 position. Each contact pad 215 is preferably spaced 0.050 inches typical. The height of the memory module 201 is preferably 2.000 inches with each indentation 205 positioned 0.700 inches from the edge that includes the contact pads 215. The depth of the memory module 201 has a preferred maximum of 0.290 inches. The portion of the printed circuit board 210 of the memory module 201 that is intended to mate with the connector 202 is preferably 0.175 inches minimum with a width of 0.050±0.004 inches.

Likewise, the dimensions of the connector 202 may also vary with each embodiment. In a preferred embodiment, the overall length of the housing 250 of the connector 202 is 6.914 inches, with 6.550 inches between the centers of the two outer placement posts 285. The overall distance covered by the solder connectors 280 is 5.95 inches, with 1.525 inches from the left end to the center of the first key 270A and 0.825 inches from the center of the second key 270B and the right end of the solder connectors 280.

FIG. 2C is a close-up view of a notch 220. Notch 220 is positioned in a space in the plurality of contact pads 215. Notch 220 is "taller" than the adjacent contact pads 215, having a preferred height of 0.175 inches minimum to a height of 0.100 inches for each contact pad 215. The preferred width of each contact pad is 0.036±0.002 inches typical. The width of the notch 220 is preferably 0.071±0.004 inches, in contrast to the wider notches typical in the prior art.

Figure 2D:
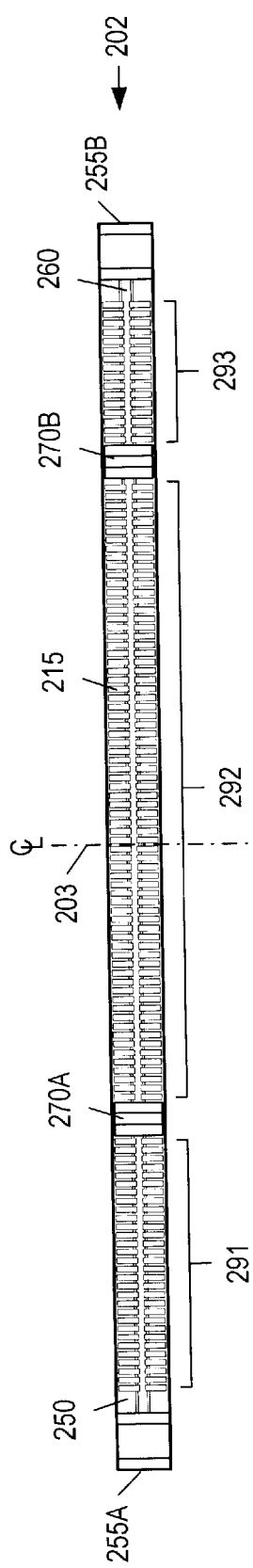
FIGS. 2D and 2E are a top view and a bottom view of the connector of FIG. 2B.
Figure 2E:
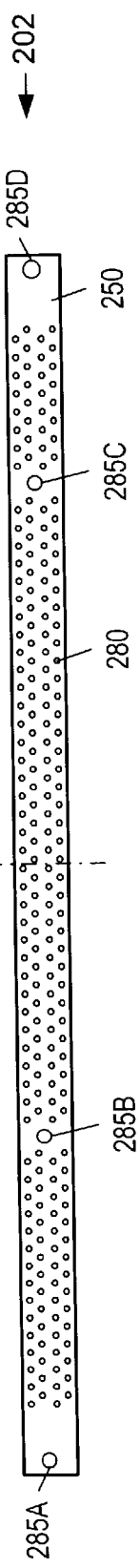

FIGS. 2D and 2E are top and bottom views of the connector 202. In FIG. 2D, a top view of the connector 202 is illustrated. The center of the connector 202 is marked by the centerline 203. The accommodating space 260 is visible running down the center of the length of the connector 202. The first key 270A and the second key 270B are shown in their respective spaces in the plurality of contacts 215. There are two module extractors 255A and 255B shown from the top at the ends of the connector 202. As shown, the keys 270A and 270B are integral components of a molding of the housing 250 of the connector 202, although an embodiment where the keys 270A and 270B are not integral components is also contemplated. The housing 250 may be comprised of non-conductive resin or plastic, as are well-known in the art.

In the embodiment illustrated, the plurality of contacts 215 are separated into three groups by the keys 270A and 270B. The first group 291 of contacts 215 is located between the left end of the connector 202 and the first key 270A. The second group 292 of contacts 215 is located between the first key 270A and the second key 270B. The third group 293 of contacts 215 is located between the second key 270B and the right end of the connector 202. As illustrated, the first key is farther from the left end of the housing 250 of the connector 202 than from the centerline 203. The second key is closer to the right end of the housing 250 of the connector 202 than to the centerline 203.

In various embodiments, there may be differing numbers of contacts 215, and the contacts 215 may be separated by the keys 270A and 270B into groups with differing numbers of contacts in each group 291, 292, and 293 of contacts 215. In one embodiment, the plurality of contacts includes at least 200 contacts. In a preferred embodiment, the plurality of contacts includes exactly 232 contacts. In various embodiments, the first key is located along the length of the housing 250 of the connector 202 between 15% and 35% of the length of the connector, as measured from the left end, and the second key is located along the length of the housing 250 of the connector between 65% and 85% of the length of the connector, also measured from the first end.

In one embodiment, the number of contacts in the second group is larger than the number of contacts in either the first group or the second group. In a contemplated embodiment, the number of contacts in the second group is larger than the number of contacts in the first group and the second group combined. In a preferred embodiment, the first group includes at least 60 contacts, the second group includes at least 140 contacts, and the third group includes at least 32 contacts.

It is noted that as shown, the plurality of contacts 215 is disposed within the accommodating space 260 so as to be vertically opposed to each other. A portion of a printed circuit board 210, such as comprised in a memory module 201, is weakly held between vertically opposed contacts in such a state where the portion of the printed circuit board 210 is inserted into the accommodating space 260, and as the printed circuit board 210 is pushed down to an implementation position, a tip of the printed circuit board 210 elastically deforms the contacts 265 so that the contact pads 215 of the printed circuit board and the contacts 265 are brought into contact with each other. The printed circuit board 210 is held in place in the accommodating space 260 by an elastic force exerted by the deformed contacts 215.

In FIG. 2E, a bottom view of the connector 202 is illustrated. The centerline 203 denotes the center of the connector 202 is this view also. The relative locations of the placement posts 285 and the plurality of solder connectors 280 are illustrated. The outer placement posts 285A and 285D are positioned towards the ends of the connector 202. The two inner placement posts 285B and 285C are positioned in the illustrated embodiment to correspond to the top side spaces in the contacts 215 for the keys 270. The diameters of the placement posts 285 are preferably 0.080±0.002 inches, except for the rightmost placement post 285D, which is 0.093±0.002 inches in diameter.

The solder connectors 280 are shown in a preferred staggered configuration, comprising four rows of solder connectors 280. Neighboring rows of solder connectors 280 are preferably separated by 0.075 inches, with 0.050 inches typical for the separation between solder connectors 280 as measured along the length of the connector 202. Each solder connector 280 is preferably 0.031±0.002 inches in diameter. As shown, "pin 1" and "pin 117" correspond to the leftmost solder connectors 280, pin 117 over pin 1. "Pin 116" and "pin 232" correspond to the rightmost solder connectors 280, pin 232 over pin 116.

Figure 3:
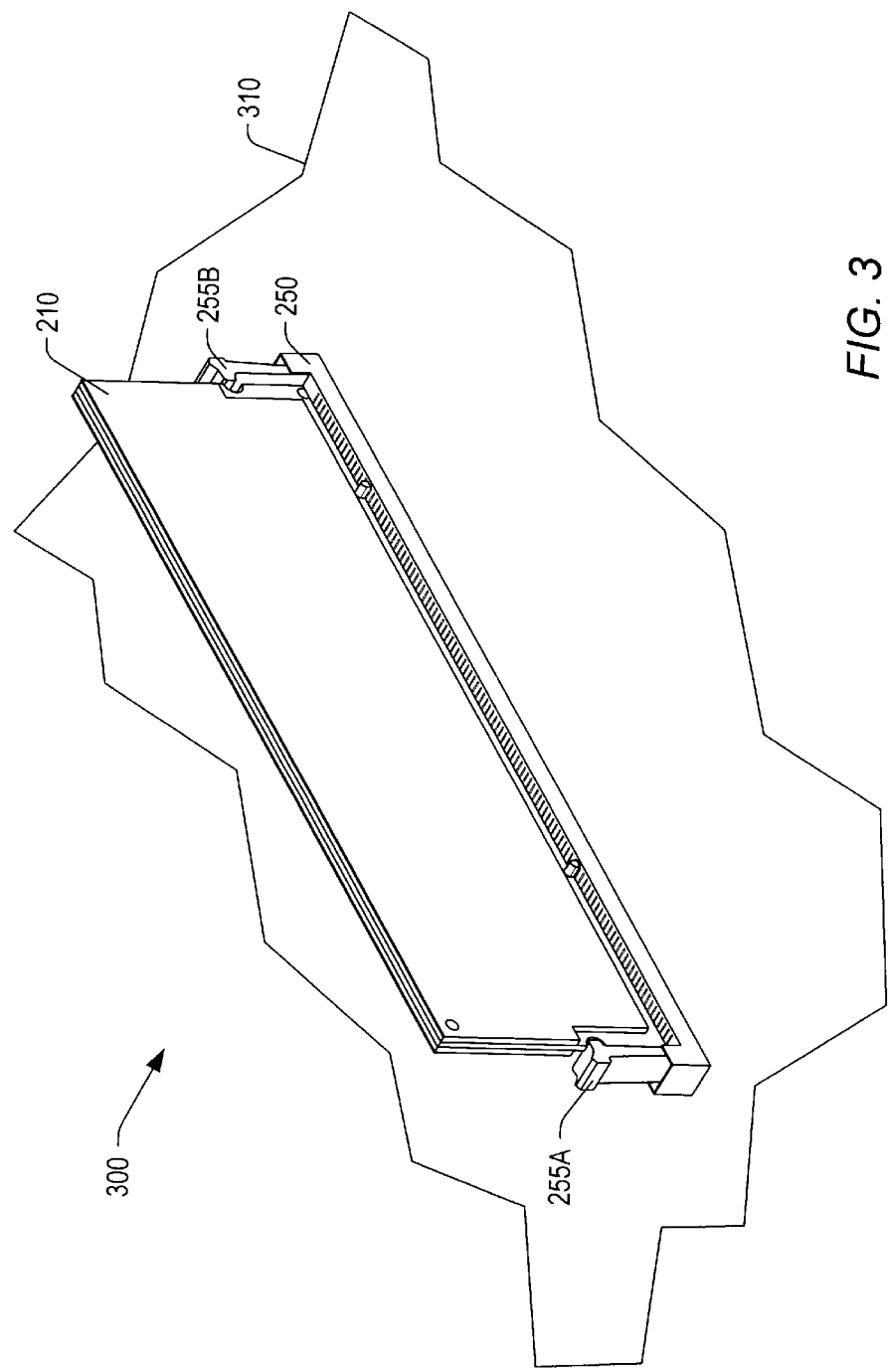
FIG. 3 is a three-dimensional cut-away view of a computer system including the memory module of FIG. 2A coupled to the connector of FIG. 2A.

In FIG. 3, a portion of a computer system 300 is illustrated that includes a circuit board 310, a connector 202 coupled to the circuit board 310, and a memory module 201 mated to the connector 202. As shown, two module extractors 255A and 255B are coupled to respective ends of the housing 250 of the connector 202. Both module extractors 255A and 255B are in the locked position and positioned in corresponding indentations of the memory module. The edge portion of the memory module 201 is received within an accommodating space of the connector 202. The first key (shown previously) of the connector 202 is positioned within the first notch (shown previously) of the memory module 201. The second key of the connector 202 is positioned within the second notch of the memory module 201. The distance between the fist key and the second key is greater than 40% of the length of the connector, and the distance between the first notch and the second notch is greater than 40% of the length of the memory module.

In various embodiments of the computer system 300, compatible embodiments of the connector 202 and/or the memory module 201 described above may be incorporated in the computer system 250. In one preferred embodiment, the computer system further comprises one or more semiconductor integrated circuits coupled to the printed circuit board 210 of the memory module 201. One or more of the semiconductor integrated circuits includes a plurality of memory cells, which are electrically coupled to various ones of the plurality of contact pads.

In various embodiments, the housing 250 of the connector 202 may be comprised of an electrically non-conducting material. The electrically non-conducting material may be composed of a resin or a plastic, or another material, as desired. In other embodiments, the memory module may be comprised of a composite including a plurality of layers. The plurality of layers may include a plurality of layers that are non-conducting. It is noted that in some embodiments, the numbers and placement of features on the memory module and/or the connector may imply a corresponding number and/or placement of corresponding features on the connector or memory module. It is also noted that on stated measurements, where an uncertainty is not expressly stated, an uncertainty of 5 in the last decimal place is implied. Numerous other variations and modifications will become apparent to those skilled in the art once the above disclosure is fully appreciated. It is intended that the following claims be interpreted to embrace all such variations and modifications.

What is claimed is:

1. A connector, comprising:
   a housing including a first end, a second end, and a center positioned midway between said first end and said second end, wherein said housing further includes an accommodating space which is adapted to accommodate a portion of a printed circuit board;
   a first key disposed within said accommodating space of said housing, wherein said first key is positioned between said first end of said housing and said center, and wherein said first key is an integral portion of a molding forming said housing;
   a second key disposed within said accommodating space of said housing, wherein said second key is positioned between said second end of said housing and said center, and wherein said second key is an integral portion of a molding forming said housing; wherein a distance between said first key and said second key is greater than 40% of a length of said housing;
   one or more placement posts disposed on said housing opposite said accommodating space, wherein said one or more placement posts are each configured to mate with corresponding holes in a mounting surface; and
   a plurality of contacts disposed within said accommodating space, wherein said plurality of contacts are configured to abut a corresponding plurality of contact pads arranged along said portion of said printed circuit board when said printed circuit board is disposed within said accommodating space;
   wherein said first key and said second key divide said plurality of contacts into three groupings of contacts, wherein said three groupings of contacts include a first grouping positioned between said first end and said first key, a second grouping positioned between said first key and said second key, and a third grouping positioned between said second key and said second end;
   wherein a portion of the second grouping of contacts is positioned at the center of the accommodating space.

2. The connector of claim 1, wherein said housing further includes a top side which defines a top plane of said accommodating space, wherein one or more of said first key and said second key extend from said accommodating space beyond said top plane.

3. The connector of claim 2, wherein said one or more of said first key and said second key extend from said accommodating space beyond said top plane by a distance of at least 0.050 inches.

4. The connector of claim 1, wherein said second key is closer to said second end of said housing than to said center.

5. The connector of claim 4, wherein said first key is at least 1.525 inches from said first end, and wherein said second key is at least 0.825 inches from said second end.

6. The connector of claim 1, wherein said plurality of contacts includes at least 232 contacts.

7. The connector of claim 1, wherein a number of said contacts in said second group is larger than the number of contacts in either said first group or said third group.

8. The connector of claim 1, wherein said first group includes at least 60 contacts, wherein said second group includes at least 140 contacts, and wherein said third group includes at least 32 contacts.

9. The connector of claim 1, wherein said number of contacts in said second group is larger than said number of contacts in said first group and said third group combined.

10. The connector of claim 1, wherein said first key is located along said length between 15% and 35% of said length, as measured from said first end, and wherein said second key is located along said length between 65% and 85% of said length, as measured from said first end.

11. The connector of claim 1, further comprising one or more module extractors each coupled to an end of said housing, wherein each of said one or more module extractors is rotationally operable to move between a closed position and an open position.

12. The connector of claim 1, wherein said one or more placement posts includes two placement posts spaced at least 3.6 inches apart.

13. The connector of claim 1, wherein a distance between said first key and said second key is greater than 50% of said length.

14. The connector of claim 13, wherein said length is at least 5.95 inches, and wherein said distance between said first key and said second key is greater than 3.0 inches.

15. A computer system, comprising:
   a mounting surface;
   a connector coupled to said mounting surface, the connector comprising:
      a housing including a first housing end, a second housing end, and a first center midway between said first housing end and said second housing end, wherein said housing further includes an accommodating space;
      a first key disposed within said accommodating space of said housing, wherein said first key is positioned between said first end of said housing and said center, and wherein said first key is an integral portion of a molding forming said housing;
      a second key disposed within said accommodating space of said housing, wherein said second key is positioned between said second housing end and said first center, and wherein said second key is an integral portion of a molding forming said housing; and
      one or more placement posts disposed on said housing opposite said accommodating space, wherein said one or more placement posts are each configured to mate with corresponding holes in the mounting surface;
      a plurality of contacts disposed within said accommodating space, wherein said plurality of contacts are configured to abut a corresponding plurality of contact pads arranged along said portion of said printed circuit board when said printed circuit board is disposed within said accommodating space;
      wherein said first key and said second key divide said plurality of contacts into three groupings of contacts, wherein said three groupings of contacts include a first grouping positioned between said first end and said first key, a second grouping positioned between said first key and said second key, and a third grouping positioned between said second key and said second end;

wherein a portion of the second grouping of contacts is positioned at the center of the accommodating space; and a memory module coupled to said connector, the memory module comprising:

a printed circuit board including a first board end, a second board end, and a second center midway between said first board end and said second board end, wherein a portion of said printed circuit board is received within said accommodating space of said connector;

a first notch positioned between said first board end and said second center, wherein said first key is disposed within said first notch; and a second notch positioned between said second board end and said second center, wherein said second key is disposed within said second notch.

16. The system of claim 15, wherein said housing further includes a top side which defines a top plane of said accommodating space, wherein one or more of said first key and said second key extend from said accommodating space beyond said top plane.

17. The system of claim 16, wherein said one or more of said first key and said second key extend from said accommodating space beyond said top plane by a distance of at least 0.050 inches.

18. The system of claim 15, wherein said second key is closer to said second end of said housing than to said center.

19. The system of claim 18, wherein said first key is at least 1.525 inches from said first end, and wherein said second key is at least 0.825 inches from said second end.

20. The system of claim 15, wherein said plurality of contacts includes at least 232 contacts.

21. The system of claim 15, wherein a number of said contacts in said second group is larger than the number of contacts in either said first group or said third group.

22. The system of claim 15, wherein said first group includes at least 60 contacts, wherein said second group includes at least 140 contacts, and wherein said third group includes at least 32 contacts.

23. The system of claim 15, wherein said number of contacts in said second group is larger than said number of contacts in said first group and said third group combined.

24. The system of claim 15, wherein said first key is located along said length between 25% and 50% of said length, as measured from said first end, and wherein said second key is located along said length between 65% and 85% of said length, as measured from said first end.

25. The system of claim 15, further comprising:

one or more module extractors each coupled to an end of said housing, wherein each of said one or more module extractors is rotationally operable to move between a closed position and an open position.

26. The system of claim 15, wherein said one or more placement posts includes two placement posts spaced at least 3.6 inches apart.

27. The system of claim 15, wherein a distance between said first key and said second key is greater than 50% of said length.

28. The system of claim 27, wherein said length is at least 5.95 inches, and wherein said distance between said first key and said second key is greater than 3.0 inches.

29. The system of claim 15, wherein said first notch is farther from said first end of said printed circuit board than from said center; and wherein said second notch is closer to said second end of said printed circuit board than to said center.

30. The system of claim 29, wherein said first notch is at least 1.45 inches from said first end, and wherein said second notch is at least 0.75 inches from said second end.

31. The system of claim 29, wherein said first notch and said second notch are each at least 0.14 inches in depth.

32. The system of claim 15, further comprising a plurality of contact pads arranged along an edge of said printed circuit board, where said plurality of contact pads are configured to abut a corresponding plurality of contacts in an accommodating space of a system when said printed circuit board is received with said accommodating space.

33. The system of claim 15, wherein a first notch is positioned in a fixed location wherein said first notch is farther from said first end of said printed circuit board than from said center.

34. The system of claim 32, wherein said plurality of contact pads includes 232 contact pads.

35. The system of claim 32, wherein said first notch and said second notch divide said length into three groups, wherein said three groups include a first group positioned between said first edge and said first notch, a second group positioned between said first notch and said second notch, and a third group positioned between said second notch and said second end, wherein a number of contacts in said second group is larger than the number of contacts in either said first group or said third group.

36. The system of claim 35, wherein said first group includes at least 60 contact pads, wherein said second group includes at least 140 contact pads, and wherein said third group includes at least 32 contact pads.

37. The system of claim 35, wherein said number of contact pads in said second group is larger than said number of contact pads in said first group and said third group combined.

38. The system of claim 15, wherein said first notch is located between 15% and 35% of said length of said printed circuit board, as measured from said first end of said printed circuit board; and wherein said second key is located along said length of said printed circuit board between 65% and 85% of said length, as measured from said first end of said printed circuit board.

39. The system of claim 15, further comprising:

one or more indentations positioned on said first end or said second end, wherein said one or more indentations are configured to receive module extractors in a closed position.

40. The system of claim 15, wherein a distance between said first notch and said second notch is greater than 50% of said length of said printed circuit board.

41. The system of claim 15, wherein said length is at least 5.95 inches, and wherein said distance between said first notch and said second notch is greater than 3.0 inches.

42. The connector of claim 1, wherein said second grouping comprises a continuous series of evenly spaced contact pads between 35% and 65% of the length of said edge.

43. The connector of claim 1, wherein said second grouping comprises a continuous series of evenly spaced contact pads covering greater than 50% of the length of said edge.

44. The connector of claim 15, wherein said second grouping comprises a continuous series of evenly spaced contact pads between 35% and 65% of the length of said edge.

45. The connector of claim 15, wherein said second grouping comprises a continuous series of evenly spaced contact pads covering greater than 50% of the length of said edge.

* * * * *